United States Patent [19]
Baertsch et al.

[11] 4,146,904
[45] Mar. 27, 1979

[54] RADIATION DETECTOR

[75] Inventors: Richard D. Baertsch, Scotia; Dale M. Brown; Marvin Garfinkel, both of Schenectady, all of N.Y.

[73] Assignee: General Electric Company, Schenectady, N.Y.

[21] Appl. No.: 861,673

[22] Filed: Dec. 19, 1977

[51] Int. Cl.² .................. H01L 27/14; G01T 1/22
[52] U.S. Cl. ................................. 357/30; 250/370
[58] Field of Search .............. 250/370, 371; 357/14, 357/29, 30

[56] References Cited
U.S. PATENT DOCUMENTS

| | | | |
|---|---|---|---|
| 3,418,473 | 12/1968 | Blue | 250/370 |
| 3,458,782 | 7/1969 | Buck et al. | 357/31 |

Primary Examiner—Alfred E. Smith
Assistant Examiner—Janice A. Howell
Attorney, Agent, or Firm—Julius J. Zaskalicky; Joseph T. Cohen

[57] ABSTRACT

In a substrate of semiconductor material of one conductivity type and high resistivity, a thin layer of the same conductivity and low resistivity is provided adjacent a major surface of the substrate. A region of opposite conductivity type is provided in the substrate adjacent the major surface to form a PN junction therewith spaced adjacent to the thin layer. Zero bias is provided on the PN junction. Minority charge carriers generated in the semiconductor substrate underlying the thin layer in response to applied radiation diffuse to the region of opposite conductivity type and are sensed.

9 Claims, 3 Drawing Figures

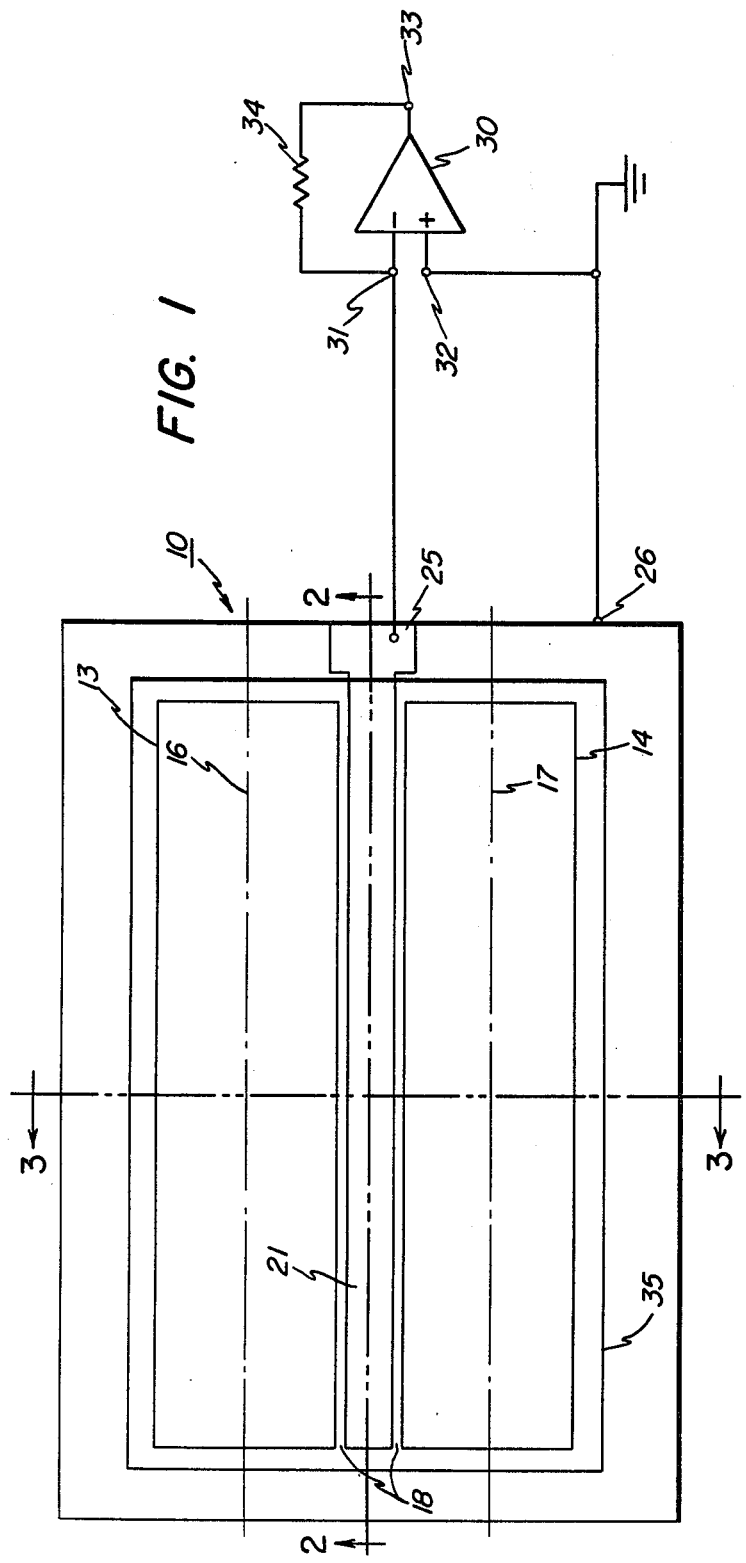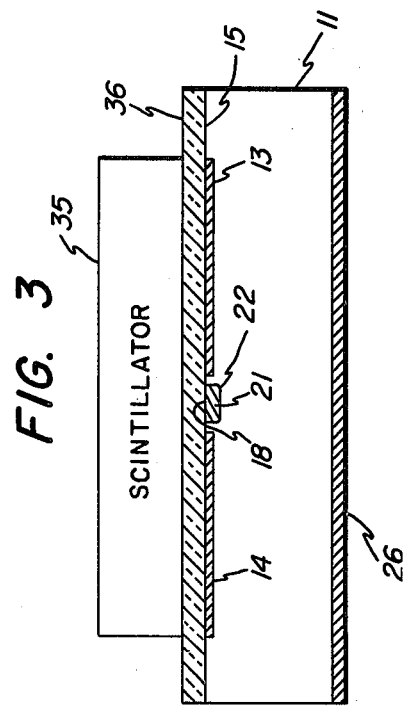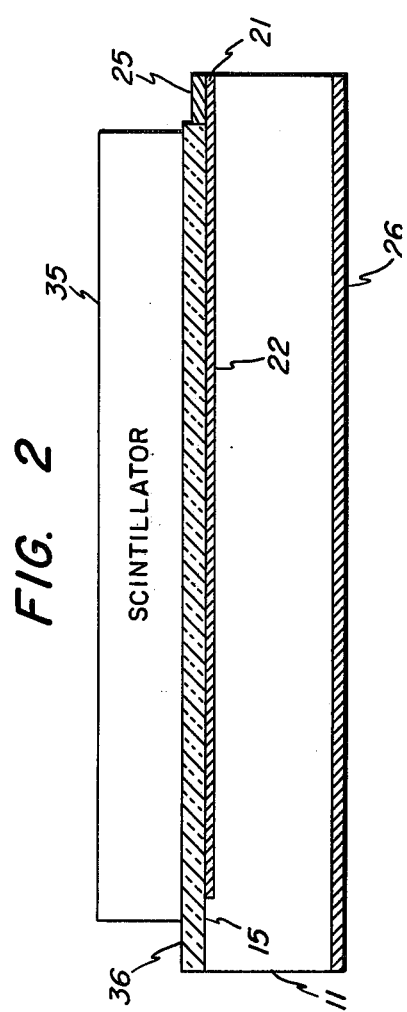

RADIATION DETECTOR

The present invention relates in general to radiation detecting devices and in particular to such devices for converting radiation in the form of X-rays and light into electrical signals.

The present invention is an improvement over the invention described and claimed in copending patent application, Ser. No. 807,080, filed June 16, 1977, now U.S. Pat. No. 4,101,924 and assigned to the assignee of the present invention.

An object of the present invention is to provide a radiation detector of high collection efficiency.

Another object of the present invention is to provide a radiation detector having high sensitivity to radiation yet providing low output capacitance for electrical signals.

A further object of the present invention is to provide a radiation detector of enhanced signal to noise ratio.

In carrying out the invention in one illustrative embodiment thereof, there is provided a substrate of semiconductor material of one conductivity type and a first resistivity. The substrate includes a thin layer of semiconductor material adjacent a major surface thereof. The thin layer is of the same conductivity type as the substrate and has a substantially lower resistivity. A region of opposite conductivity type is provided in the substrate adjacent the major surface of the substrate forming a PN junction therewith. The PN junction has a first edge in the major surface spaced adjacent to an edge of the thin layer of semiconductive material. The area of the thin layer of semiconductive material is substantially larger than the area of the region of opposite conductivity type in the major surface of the substrate. Output means are connected in circuit with the PN junction for sensing the flow of minority carrier charge generated in the substrate.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIG. 1 is a plan view of a radiation sensing device in accordance with the present invention;

FIG. 2 is a sectional view of the device of FIG. 1 taken along section lines 2—2 showing the internal construction thereof;

FIG. 3 is another sectional view of the device of FIG. 1 taken along section lines 3—3 also showing the internal construction thereof.

Referring now to FIGS. 1, 2 and 3 there is shown a radiation sensing device 10 including a substrate 11 of monocrystalline silicon semiconductor material of N-type conductivity and relatively high resistivity. Thin layers 13 and 14 of semiconductor material of the same conductivity type as the substrate and of a substantially lower resistivity, are provided in the substrate adjacent a major surface 15 of the substrate. The thin layers 13 and 14 are of elongated outline having longitudinal axes 16 and 17, respectively; and are located with longitudinal axes parallel and adjacent longitudinal edges spaced apart to form a narrow gap 18. An elongated region of P-type conductivity is provided in the gap 18 adjacent the major surface 15 of the substrate and forming a PN junction 22 therewith. The PN junction 22 has one longitudinal edge closely spaced to an adjacent longitudinal edge of thin layer 13 and has the other longitudinal edge thereof closely spaced to an adjacent longitudinal edge of thin layer 14. The surface area of each of thin layers 13 and 14 of semiconductor material are substantially greater than the surface area of mid P-type region 21. Conveniently, the resistivity of the substrate 11 may be 10 ohm centimeters and 10 mils thick. The thin layers 13 and 14 may have a resistivity of 0.05 ohm centimeters and be 0.1 micron thick. The adjacent longitudinal edges of the thin layers 13 and 14 may be spaced apart by 1 mil and the width of the longitudinal P-type region may be 0.2 of a mil. The thin layers 13 and 14 may be provided by ion implantation. Terminal 25 provides conductive connection to the P-type region 21. Terminal 26 secured to the bottom surface of the substrate 11 provides conductive connection thereto.

FIG. 1 also shows a circuit for operation of the device 10 including a differential amplifier 30 having an inverting terminal 31, a noninverting terminal 32, and an output terminal 33. The non-inverting terminal 32 is connected to ground and to the substrate terminal 26. The inverting terminal 31 is connected to terminal 25 for the P-type region 21. A feedback resistance 34 is connected between the output terminal 33 and the non-inverting terminal 31. The high gain differential amplifier 30 with resistive feedback functions to maintain the differential in voltage between the inverting terminal 31 and the non-inverting terminal 32 close to zero. Ground potential of non-inverting terminal 32 appears on the P-type region 21 and establishes zero bias on the PN junction 22.

The thin layers 13 and 14 of the same conductivity type as the substrate 11 but of lower resistivity establishes a built-in field or voltage gradient adjacent the major surface 15 of the substrate which repels minority carriers, i.e., holes in the embodiment described. Thus, any minority charge generated in the regions underlying N-type layers 13 and 14 as a result of incident radiation or from thermal excitation diffuses to the P-type region 21 and to the terminal 26. As terminals 31 and 32 are maintained at the same potential as a consequence of the action of the amplifier 30, the generated charge flows through the resistor 34 to the output terminal 33. Thus, the potential on the terminal 33 is proportional to the radiation induced current flow through the resistance 43. Preferably the layers 13 and 14 are made of sufficient thickness to provide the built-in field while not so thick as to significantly attenuate incident radiation.

A particular advantage of the detector of the present invention is that the charge generation and collection function and the charge sensing function as separated. The areas of the thin layers 13 and 14 may be made very large in relation to the surface area of the P-type region 21, for example 100 times, to provide a large area from which charge is collected while the area of the P-type region 21 may be kept quite small to provide low output capacitance and hence high voltage output in relation to photon input. Alternatively, if smaller values of output capacitance are desired to improve the sensitivity of the detector a reverse bias may be provided on the PN junction by appropriately biasing non-inverting terminal 32 with respect to ground by a suitable bias source.

For utilization of the device to detect radiation to which the semiconductor is transparent such as, for example, X-rays, suitable conversion means for converting X-rays to light to which the semiconductor material is responsive is provided. To this end, in FIGS. 1, 2 and 3 is shown a scintillator 35 suitable for the conversion of X-rays into light to which silicon is more responsive. The scintillator 35 is situated on a thin layer 36 of insulation, such as silicon dioxide, overlying the major surface 15 of the substrate. The scintillator 45 may be constituted of a material such as cesium iodide.

In the detector of the present invention, charge carriers generated and collected in the regions underlying thin layers 13 and 14 move by diffusion to the output region 21 where they may be stored or read out. The time to travel from the point of generation in these regions to the output region is a function of the square of the distance between the point of generation and the output region. Thus, the speed of response of the detector is limited by the diffusion of those carriers which are generated farthest from the output region of opposite conductivity type. Thus, the speed of response will be inverse to the square of the width of the regions underlying the layers 13 and 14. In the detector described in connection with FIGS. 1-3, the provision of elongated layers 13 and 14 and an elongated region 21 of opposite conductivity type keeps the distance that carriers must travel to reach the output region 21 to a minimum, and thus provides a high speed of response. This high speed of response is at the expense of some decrease in sensitivity due to increased area of the output P-N junction. A number of electrically connected elongated regions of opposite conductivity type may be provided on a common substrate, each with its pair of associated thin layers of low resistivity semiconductor material to enhance the speed of response. The number and spacing of such elongated regions is chosen so as to obtain the desired speed of response.

In the operation of the detector of the present invention, a substantial improvement in signal to noise ratio is obtained over the detector of the aforementioned U.S. Pat. No. 4,101,924. The improvement derives the fact that the depletion regions underlying the electrodes of the aforementioned patent application in which minority carrier charge is generated and collected is eliminated and a built-in field is provided by the thin layer of low resistivity at the surface of the substrate which inhibits the flow of minority carrier charge thereto. Additional advantages over prior art detectors are ease of fabrication and also ease of operation in that only two terminals are required. While the provisions of a thin more heavily doped layer at the surface of the substrate attenuates short wavelengths of light and has a shorter lifetime for minority carriers, these characteristics can be minimized by making the thin layer only as thick as required to provide the built-in field, as explained above.

A particular advantageous organization of materials for the detector of the present invention comprises a substrate of silicon having a resistivity of 10 ohm centimeters and thin layers 13 and 14 about 0.1 micron thick and having a resistivity of 0.05 ohm centimeters. A passivating layer 36 of silicon dioxide 0.1 micron thick is provided over the substrate. The silicon dioxide has a band gap of about 10.5 electron volts and hence would transmit radiation from deep in the ultraviolet portion of the spectrum well into the infra-red portion of the spectrum. The detector response would be determined primarily by the response of the silicon substrate. This response in terms of quantum efficiency as a function of wavelength would be excellent from deep in the ultraviolet portion of the spectrum into the short wavelength part of the infra-red portion of the spectrum.

While separate thin layers 13 and 14 are utilized in the device of FIG. 1, it will be understood that a single thin layer could have been utilized with the P-type region 21 contacting the thin layer with some advantage in simplicity of fabrication.

While the invention has been described in connection with devices made of silicon semiconductor material, it is understood that the invention is equally applicable to devices made of other semiconductor materials, such as germanium, gallium phosphide and gallium arsenide.

While the invention has been described in connection with devices constituted of a semiconductor substrate of N-type conductivity with a P-type output region, it will be understood that P-type substrates with an N-type output region could as well be used. In such a case, of course, the thin layers 13 and 14 would be of P-type conductivity and lower resistivity than the substrate, and the applied potentials would be reversed in polarity.

While in the circuit of FIG. 1, the P-region 21 was operated with zero bias, it will be understood that the P-region 21 may be operated with reverse bias with respect to the substrate. Biasing the non-inverting terminal 32 negatively with respect to ground would provide such a circuit. Other output circuits may be utilized with the device of FIG. 1; for example, the output circuit described and claimed in patent application Ser. No. 846,543, filed Oct. 28, 1977, and assigned to the assignee as the present invention.

While the invention has been described in specific embodiments, it would be understood that modifications may be made by those skilled in the art and it is intended by the appended claims to cover all such modifications and changes as fall within the true spirit and scope of the invention.

We claim:

1. A radiation sensing device comprising
   a substrate of monocrystalline semiconductor material of one conductivity type and a first resistivity,
   said substrate including a thin layer of said one conductivity type and of a second resistivity at a major surface thereof, said second resistivity being substantially lower than said first resistivity,
   a region of opposite conductivity type in said substrate adjacent said major surface of said substrate forming a PN junction therewith, said PN junction having a first edge spaced adjacent to an edge of said thin layer of semiconductive material,
   the area of said thin layer of semiconductor material being substantially larger than the area of said region of opposite conductivity,
   output means connected in circuit with said PN junction for sensing the flow of minority carrier charge generated in said substrate.

2. The device of claim 1 in which said PN junction is contiguous to said thin layer of one conductivity type.

3. The device of claim 1 in which said first resistivity is at least 10 times said second resistivity.

4. The device of claim 1 in which said output means includes means for reversely biasing said PN junction.

5. The device of claim 1 in which said output means includes means for zero biasing said PN junction.

6. The device of claim 1 in which both said thin layer and said region of opposite conductivity type are of elongated configurations and in which said first edge of said PN junction is substantially linear and substantially parallel to the longitudinal axis of said thin layer.

7. The device of claim 6 in which a second thin layer of said one conductivity type and of said second resistivity is included in said substrate at a major surface thereof, in which said PN junction has a second substantially linear edge, said second linear edge being closely spaced to an edge of said second thin layer and being substantially parallel to the longitudinal axis thereof.

8. The device of claim 1 in which said semiconductor material is silicon.

9. The device of claim 1 in which a scintillator overlies said thin layer of said one conductivity type.